(12) United States Patent
Cheng et al.

(10) Patent No.: US 11,539,030 B2
(45) Date of Patent: Dec. 27, 2022

(54) OLED ENCAPSULATION STRUCTURE, PROTECTIVE FILM THEREFOR, AND MANUFACTURING METHOD OF THE PROTECTIVE FILM

(71) Applicant: Wuhan China Star Optoelectronics Semiconductor Display Technology Co., Ltd., Wuhan (CN)

(72) Inventors: Jiayou Cheng, Wuhan (CN); Chienlin Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 34 days.

(21) Appl. No.: 16/478,130

(22) PCT Filed: Nov. 1, 2018

(86) PCT No.: PCT/CN2018/113250
§ 371 (c)(1),
(2) Date: Jul. 16, 2019

(87) PCT Pub. No.: WO2020/056862
PCT Pub. Date: Mar. 26, 2020

(65) Prior Publication Data
US 2020/0144545 A1 May 7, 2020

(30) Foreign Application Priority Data
Sep. 17, 2018 (CN) .......................... 201811082073.4

(51) Int. Cl.
*H01L 51/52* (2006.01)
*B32B 7/12* (2006.01)
(Continued)

(52) U.S. Cl.
CPC ............ *H01L 51/5256* (2013.01); *B32B 7/12* (2013.01); *B32B 27/08* (2013.01); *H01L 51/56* (2013.01);
(Continued)

(58) Field of Classification Search
None
See application file for complete search history.

(56) References Cited

U.S. PATENT DOCUMENTS

| 5,137,787 | A | * | 8/1992 | Shepherd | ................ B29C 43/28 |
| | | | | | 428/423.7 |
| 2006/0061272 | A1 | * | 3/2006 | McCormick | ........ H01L 51/5253 |
| | | | | | 313/512 |

(Continued)

FOREIGN PATENT DOCUMENTS

| CN | 205202365 | 5/2016 |
| CN | 108470762 | 8/2018 |

(Continued)

*Primary Examiner* — Frank J Vineis
*Assistant Examiner* — Nicole T Gugliotta
(74) *Attorney, Agent, or Firm* — PV IP PC; Wei Te Chung; Ude Lu

(57) ABSTRACT

The present invention discloses an organic light-emitting diode (OLED) encapsulation structure, a protective film therefor, and a manufacturing method of the protective film, the protective film includes a base film and an auxiliary film disposed on at least two opposite sides of the base film, and connected to the base film, wherein the auxiliary film is softer than the base film, and when the protective film covers the OLED encapsulation structure, the base film covers a top portion of the OLED encapsulation structure, and the auxiliary film covers at least two opposite sides of the OLED encapsulation structure.

7 Claims, 4 Drawing Sheets

(51) Int. Cl.
*B23B 27/08* (2006.01)
*B32B 27/08* (2006.01)
*H01L 51/56* (2006.01)

(52) U.S. Cl.
CPC ... *B32B 2307/536* (2013.01); *B32B 2457/206* (2013.01); *H01L 51/5237* (2013.01)

(56) References Cited

U.S. PATENT DOCUMENTS

| | | | |
|---|---|---|---|
| 2009/0169904 A1* | 7/2009 | Yamada | C08J 7/0423 |
| | | | 428/458 |
| 2016/0150062 A1 | 5/2016 | Rhee | |
| 2017/0154938 A1* | 6/2017 | Su | H01L 27/3262 |
| 2019/0127609 A1* | 5/2019 | Johnson | B32B 27/302 |
| 2019/0198408 A1* | 6/2019 | Zhang | H01L 27/1218 |

FOREIGN PATENT DOCUMENTS

| | | | | |
|---|---|---|---|---|
| KR | 10-2016-0108088 | | 9/2016 | |
| KR | 2016-108088 | * | 9/2016 | ............. B28B 27/08 |
| WO | WO 2018/214634 | * | 11/2018 | ............. H01L 27/32 |

\* cited by examiner

US 11,539,030 B2

OLED ENCAPSULATION STRUCTURE, PROTECTIVE FILM THEREFOR, AND MANUFACTURING METHOD OF THE PROTECTIVE FILM

RELATED APPLICATIONS

This application is a National Phase of PCT Patent Application No. PCT/CN2018/113250 having International filing date of Nov. 1, 2018, which claims the benefit of priority of Chinese Patent Application No. 201811082073.4 filed on Sep. 17, 2018. The contents of the above applications are all incorporated by reference as if fully set forth herein in their entirety.

FIELD AND BACKGROUND OF THE INVENTION

The present application relates to a field of display technologies, and in particular, to an organic light-emitting diode (OLED) encapsulation structure, a protective film therefor, and a manufacturing method of the protective film.

Currently, organic light-emitting diodes (OLEDs) are a new type of illumination and display technology with many excellent features. Compared with conventional liquid crystal displays, OLEDs have self-luminance, wide viewing angles, high contrast, an ultra-fast response rate, light weight, smaller thickness and flexibility, so that OLEDs have a wide application prospect in the field of display.

However, because OLEDs are very sensitive to oxygen, water, etc., oxygen, water may penetrate into OLED devices and affect service life. Therefore, OLED devices are usually encapsulated in an encapsulation structure to isolate water vapor and oxygen. In order to encapsulate the OLEDs in the production process and meet the requirements of being flexible, light weight and thin in thickness, it is necessary to apply a protective film to the OLED semi-finished product. For the following process, a release force of the protective film should not be too high, otherwise the quality of the encapsulation film layer will be destroyed, so that affects the encapsulation effect. However, an edge of the OLED is prone to be contaminated by dust or particles, which affect the product yield.

Technical problem: the embodiments according to the present invention provide an OLED encapsulation structure, a protective film therefor, and a manufacturing method of the protective film, which can effectively protect the OLED encapsulation structure, and can better avoid dust contamination at an edge portion of the OLED encapsulation structure, and can improve product yield and production efficiency.

SUMMARY OF THE INVENTION

An embodiment according to the present application provides a protective film for an organic light-emitting diode (OLED) encapsulation structure, including: a base film; and an auxiliary film disposed on at least two opposite sides of the base film, and connected to the base film, wherein the auxiliary film is softer than the base film, and when the protective film covers the OLED encapsulation layer, the base film covers a top portion of the OLED encapsulation layer, and the auxiliary film covers at least two opposite sides of the OLED encapsulation layer.

The protective film for the OLED encapsulation structure described in the embodiments according to the present application, the base film includes a first base film and a second base film, and the first base film and the second base film being stacked on one another; wherein the auxiliary film includes a first auxiliary film and a second auxiliary film, and the first auxiliary film and the second auxiliary film being stacked on one another; and wherein the first auxiliary film is connected to at least two opposite sides of the first base film, and the second auxiliary film is connected to at least two opposite sides of the second base film.

The protective film for the OLED encapsulation structure described in the embodiments according to the present application, a material of the first base film and a material of the first auxiliary film are selected from the group consisting of polyethylene terephthalate (PET), ortho-phenylphenol (OPP) and polymethylmethacrylate (PMMA).

The protective film for the OLED encapsulation structure described in the embodiments according to the present application, a material of the second base film and a material the second auxiliary film are selected from the group consisting of an acrylic adhesive, a silicone adhesive, and a polyurethane (PU) adhesive.

The protective film for the OLED encapsulation structure described in the embodiments according to the present application, the first auxiliary film covers a peripheral surface of the first base film, and the second auxiliary film covers a periphery surface of the second base film.

The protective film for the OLED encapsulation structure described in the embodiments according to the present application, viscosity of the second auxiliary film is less than or equal to viscosity of the first auxiliary film.

The protective film for the OLED encapsulation structure described in the embodiments according to the present application, the protective film further includes a release film, and wherein before the protective film is used to cover the OLED encapsulation structure, a lower surface of the base film and a lower surface of the auxiliary film are laminated on an upper surface of the release film.

Another embodiment according to the present application further provides an organic light-emitting diode (OLED) encapsulation structure including:
a base layer;
a connecting layer;
an OLED encapsulation layer, the OLED encapsulation layer including a first inorganic material layer, a second inorganic material layer, and an organic material layer disposed between the first inorganic material layer and the second inorganic material layer; and
a protective layer, the protective layer disposed on a top portion of the OLED encapsulation layer,
wherein the protective layer is a protective film for the OLED encapsulation structure, and
wherein the protective film includes a base film; and an auxiliary film disposed on at least two opposite sides of the base film, and connected to the base film, wherein the auxiliary film is softer than the base film, wherein when the protective film covers the OLED encapsulation layer, the base film covers a top portion of the OLED encapsulation layer, and the auxiliary film covers at least two opposite sides of the OLED encapsulation layer.

The protective film for the OLED encapsulation structure described in the embodiments according to the present application, the connecting layer is an evaporating layer, and the OLED encapsulation layer is connected to the base layer through the evaporating layer.

The protective film for the OLED encapsulation structure described in the embodiments according to the present application, the base film includes a first base film and a second base film, and the first base film and the second base film being stacked on one another; wherein the auxiliary film includes a first auxiliary film and a second auxiliary film, and the first auxiliary film and the second auxiliary film being stacked on one another; and wherein the first auxiliary film is connected to at least two opposite sides of the first base film, and the second auxiliary film is connected to at least two opposite sides of the second base film.

The protective film for the OLED encapsulation structure described in the embodiments according to the present application, a material of the first base film and a material of the first auxiliary film are selected from the group consisting of polyethylene terephthalate (PET), ortho-phenylphenol (OPP) and polymethylmethacrylate (PMMA).

The protective film for the OLED encapsulation structure described in the embodiments according to the present application, a material of the second base film and a material the second auxiliary film are selected from the group consisting of an acrylic adhesive, a silicone adhesive, and a polyurethane (PU) adhesive.

The protective film for the OLED encapsulation structure described in the embodiments according to the present application, the first auxiliary film covers a peripheral surface of the first base film, and the second auxiliary film covers a periphery surface of the second base film.

The protective film for the OLED encapsulation structure described in the embodiments according to the present application, viscosity of the second auxiliary film is less than or equal to viscosity of the first auxiliary film.

The protective film for the OLED encapsulation structure described in the embodiments according to the present application, the protective film further includes a release film, and wherein before the protective film is used to cover the OLED encapsulation layer, a lower surface of the base film and a lower surface of the auxiliary film are laminated on an upper surface of the release film.

The protective film for the OLED encapsulation structure described in the embodiments according to the present application, when the protective film covers the OLED encapsulation layer, the base film covers the first inorganic material layer disposed on the top portion of the OLED encapsulation layer, and the auxiliary film covers a peripheral surface of the OLED encapsulation layer.

The protective film for the OLED encapsulation structure described in the embodiments according to the present application, after the auxiliary film covered the peripheral surface of the OLED encapsulation layer, the auxiliary film automatically falls down and extends along the peripheral surface of the OLED encapsulation layer to the base layer.

An embodiment according to the present application yet provides a manufacturing method of a protective film for an organic light-emitting diode (OLED) encapsulation structure, including steps of:

forming a base film;

forming an auxiliary film on at least two opposite sides of the base film, wherein the auxiliary film is softer than the base film.

The manufacturing method of protective film for the OLED encapsulation structure described in the embodiments according to the present application, the method further includes step of: forming a release film on a lower surface of the base film and a lower surface of the auxiliary film.

The manufacturing method of protective film for the OLED encapsulation structure described in the embodiments according to the present application, the step of forming the base film includes step of: forming a first base film and a second base film which are stacked on one another; and wherein the step of forming the auxiliary film on the at least two opposite sides of the base film, including step of:

forming a first auxiliary film on at least two opposite sides of the first base film, wherein the first auxiliary film is softer than the first base film, and forming a second auxiliary film on at least two opposite sides of the second base film, wherein the second auxiliary film is softer than the second base film.

Benefit of the present application: the protective film for the OLED encapsulation structure provided by the embodiments of the present application, the protective film includes a base film and an auxiliary film disposed on at least two opposite sides of the base film, and connected to the base film, wherein the auxiliary film is softer than the base film, and when the protective film covers the OLED encapsulation layer, the base film covers a top portion of the OLED encapsulation layer, and the auxiliary film covers at least two opposite sides of the OLED encapsulation layer. The protective film provided by the embodiments according to the present invention can effectively protect the OLED encapsulation structure, and can better avoid the dust contamination at an edge portion of the OLED encapsulation structure, and can improve product yield and production efficiency.

BRIEF DESCRIPTION OF THE SEVERAL VIEWS OF THE DRAWINGS

To more clearly illustrate the technical solutions in the embodiments of the present invention, the drawings used in the description of the embodiments will be briefly described below. It is apparent that the drawings accompanying with the following description are only some embodiments of the present invention. Other drawings can also be obtained from those skilled in the art based on these drawings without paying any creative effort.

DETAILED DESCRIPTION OF PREFERRED SPECIFIC EMBODIMENTS OF THE INVENTION

Figure 1:
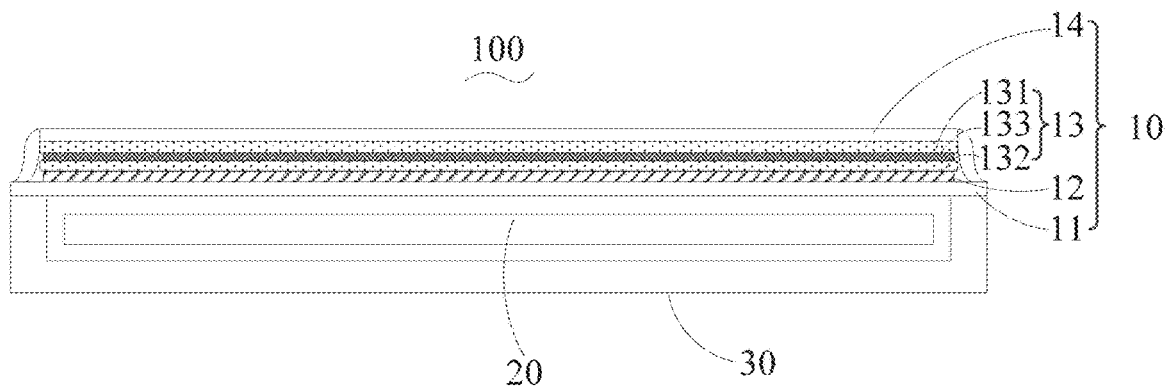
FIG. 1 is a schematic structural view of an electronic device according to an embodiment of the present application.

The embodiments of the present invention are described in detail below, and the examples of the implementation are illustrated in the drawings, and the same or similar reference numerals indicate the same or similar elements or elements having the same or similar functions. The embodiments described below with reference to the drawings are intended to be illustrative of the present invention and cannot be understood as limitations of the present invention.

In the description of the present invention, it is to be understood that the terms "center", "longitudinal", "transverse", "length", "width", "thickness", "upper", "lower", "front", "back", "left", "right", "vertical", "horizontal", "top", "bottom", "inner", "outer", "clockwise", "counterclockwise", etc., indicated orientation or positional relationship are based on the orientation or positional relationship shown in the drawings, and are merely for the convenience of describing the present invention and simplifying the description, instead of indicating or implying that the device or component referred to must have a particular orientation, constructed and operated in a particular orientation. Therefore, it cannot be constructed as a limitation of the present invention. Moreover, the terms "first" and "second" are only used for descriptive purposes and are not to be construed as indicating or implying a relative importance or implicitly indicating the number of technical features indicated. Thus, features defined "first" or "second" may include one or more features either explicitly or implicitly. In the description of the present invention, the term "a plurality of" may be two or more than two, unless otherwise specifically defined.

In the description of the present invention, it should be noted that the terms "mount", "connect to", and "connection" should be understood broadly, for example, it can be a fixed connection, a removeable connection, or connected in one piece; it can be a mechanical connection, it can also be electrically connected or can be communicated with each other; it can be directly connected, it can also be indirectly connected through an intermediary medium. It can be the internal communication of two elements or the interaction of two elements. For those of ordinary skill in the art, the specific meaning of the above terms of the present invention can be understood on a case-by-case basis.

In the present invention, unless otherwise expressly stated and defined, a first feature "above" or "under" a second feature may include that the first feature directly contacts with the second feature, and may also include that the first feature does not directly contact with the second feature. Moreover, the first feature "on", "above" and "over" the second feature includes the first feature right above and oblique upper the second feature, or merely indicating that a level of the first feature is higher than a level of the second feature. The first feature "below", "under" and "beneath" the second feature includes the first feature right below and oblique below the second feature, or merely indicating that a level of first feature is less than a level of the second feature.

The following disclosure provides many different embodiments or examples for implementing different structures of the present invention. In order to simplify the disclosure of the present invention, the components and arrangements of the specific examples are described below. Certainly, they are merely examples and are not intended to limit the invention. In addition, the present invention may be repeated with reference numerals and/or reference letters in the different examples, which are for the purpose of simplicity and clarity, and do not indicate the relationship between the various embodiments and/or arrangements discussed. Moreover, the present invention provides examples of various specific processes and materials, but one of ordinary skill in the art will recognize that other processes and/or the use of other materials can be used.

Embodiments according to the present application provide an organic light-emitting diode (OLED) encapsulation structure, a protective film therefor, and a manufacturing method of the protective film. The OLED encapsulation structure can be integrated into a display panel or an electronic device, and the OLED encapsulation structure can be manufactured by using a manufacturing method of the OLED encapsulation structure according to the present invention, and the electronic device can be a smart wearable device, a smart phone, a tablet computer, a smart TV, and the like.

In the existing OLED manufacturing process, a protective film for a film attaching machine is simple in design, but cannot effectively block the dust contamination. The present application provides a protective film for an OLED encapsulation structure, after a thin film encapsulation (TFE) process, to supply the protective film to a laminator device to attach on a base layer during the OLED manufacturing process, which is used to protect an OLED semi-finished product and effectively prevent dust contamination.

Please refer to FIG. 1. FIG. 1 is a schematic structural view of an electronic device according to an embodiment of the present application. The electronic device 100 can include a cover plate, a display panel 10, a control circuit 20, and a housing 30. It should be noted that the electronic device 100 shown in FIG. 1 is not limited to the elements above, and may further include other elements, such as a camera, an antenna structure, a fingerprint module for unlocking, and the like.

The display panel 10 is disposed on the housing 30. The display panel 10 can be an OLED encapsulation structure.

The OLED encapsulation structure 10 may include a base layer 11, a connecting layer 12, an OLED encapsulation layer 13, and a protective layer 14.

The OLED encapsulation layer 13 includes a first inorganic material layer 131, a second inorganic material layer 132, and an organic material layer 133 disposed between the first inorganic material layer 131 and the second inorganic material layer 132.

The protective layer 14 is disposed on a top portion of the OLED encapsulation layer 13, and the protective layer 14 may be a protective film.

In some embodiments, the connecting layer 12 may be an evaporating layer, and the OLED encapsulation layer 13 is connected to the base layer 11 through the evaporating layer 12.

In some embodiments, the display panel 10 can be secured on the housing 30, and the display panel 10 and the housing 30 form an enclosed space to accommodate components such as the control circuit 20.

In some embodiments, the housing 30 can be made of a flexible material, such as a plastic housing or a silicone housing.

The control circuit 20 is mounted in the housing 30. The control circuit 20 can be a main board of the electronic device 100. The control circuit 20 can be integrated with one, two or more of selected from the group consisting of a battery, an antenna structure, a microphone, a speaker, a headphone interface, a universal serial bus interface, a camera, a proximity sensor, an ambient light sensor, a receiver, and processor.

The display panel 10 is mounted in the housing 30, and the display panel 10 is electrically connected to the control circuit 20 to form a display surface of the electronic device 100. The display panel 10 may include a display area and a non-display area. The display area can be configured to display an image on the electronic device 100, or to perform a touch operation for a user, or the like. This non-display area can be configured to provide various functional components.

Figure 2:
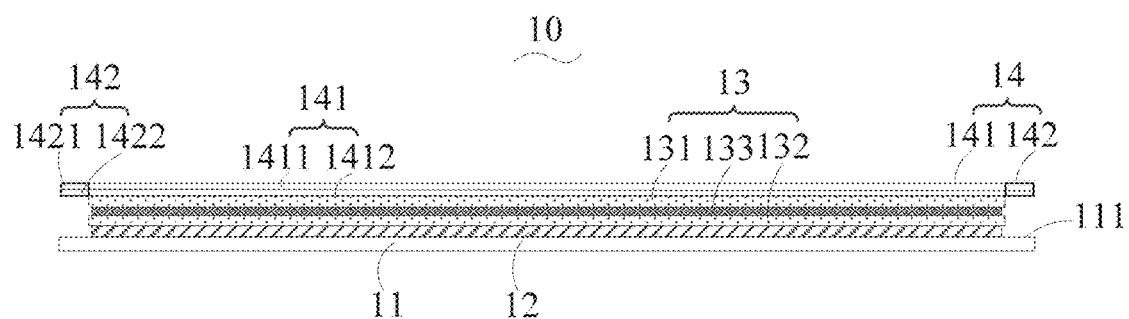
FIG. 2 is a schematic structural view of an organic light-emitting diode (OLED) encapsulation structure according to an embodiment of the present application.
Figure 3:
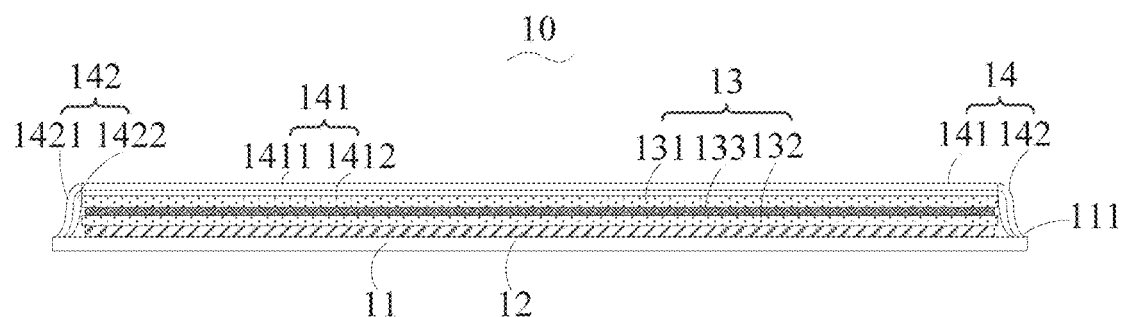
FIG. 3 is another schematic structural view of an OLED encapsulation structure according to an embodiment of the present application.

Please refer to FIG. 2 and FIG. 3, FIG. 2 is a schematic structural view of an OLED encapsulation structure according to an embodiment of the present application, and FIG. 3 is another schematic structural view of an OLED encapsulation structure according to an embodiment of the present application. The OLED encapsulation structure 10 may include a base layer 11, a connecting layer 12, an OLED encapsulation layer 13, and a protective layer 14.

The OLED encapsulation layer 13 includes a first inorganic material layer 131, a second inorganic material layer 132, and an organic material layer 133 disposed between the first inorganic material layer 131 and the second inorganic material layer 132.

In some embodiments, the connecting layer 12 may be an evaporating layer, and the OLED encapsulation layer 13 is connected to the base layer 11 through the evaporating layer 12.

The protective layer 14 is disposed on a top portion of the OLED encapsulation layer 13, and the protective layer 14 may be a protective film.

As shown in FIG. 3, the protective film 14 may include a base film 141 and an auxiliary film 142. The auxiliary film 142 is disposed on at least two opposite sides of the base film 141, and the auxiliary film 142 is connected to the base film 141. The auxiliary film 142 is softer than the base film 141. When the protective film 14 covers the OLED encapsulation layer 13, the base film 141 covers a top portion of the OLED encapsulation layer 13, and the auxiliary film 142 covers at least two opposite sides of the OLED encapsulation layer 13.

Specifically, when the protective film 14 covers the OLED encapsulation layer 13, the base film 141 covers the first inorganic material layer 131 which is on the top portion of the OLED encapsulation layer 13, and the auxiliary film 142 covers the at least two opposite sides of the OLED encapsulation layer 13. For example, the auxiliary film 142 covers a peripheral surface of the OLED encapsulation layer 13, and because the auxiliary film 142 is softer than the base film 141, after the peripheral surface of the OLED package structure 10 is covered, the auxiliary film 142 extends along the peripheral surface of the OLED package structure 10 to an upper surface 111 of the base layer 11. A portion of the auxiliary film 142 which is extending to the upper surface 111 of the base layer 11 is attached to a non-projecting area of the upper surface 111 of the base layer 11, where the non-projecting area is outside an area that the OLED package structure 10 is projecting on the base layer, so the connecting layer 12 and the OLED encapsulation layer 13 which is disposed in the OLED package structure 10 are encapsulated in an enclosed space formed between the protective film 14 and the base layer 11, such that an edge portion of the OLED package structure can be effectively sealed, and therefore effectively avoids dust contamination at the edge portion.

For example, after the auxiliary film 142 covers the peripheral surface of the OLED encapsulation layer 13, the auxiliary film 142 will automatically fall down to extend to the base layer 11 along the peripheral surface of the OLED encapsulation layer 13, may extend to the upper surface of the base layer 11, and may also extend to a side surface of the base layer 11. So the auxiliary film 142 covers the at least two opposite sides of the OLED encapsulation layer 13, for example, covers the peripheral surface of the OLED encapsulation layer 13.

In some embodiments, the base film 141 includes a first base film 1411 and a second base film 1412, and the first base film 1411 and the second base film 1412 are stacked on one another. The auxiliary film 142 includes a first auxiliary film 1421 and a second auxiliary film 1422, the first auxiliary film 1421 and the second auxiliary film 1422 are stacked on one another, the first auxiliary film 1421 is connected to the at least two opposite sides of the first base film 1411, and the second auxiliary film 1422 is connected to the at least two opposite sides of the second base film 1412.

For example, material of the first base film 1411 and material of the first auxiliary film 1421 may be selected from the group consisting of polyethylene terephthalate (PET), ortho-phenylphenol (OPP), and polymethylmethacrylate (PMMA).

For example, material of the second base film 1412 and material of the second auxiliary film 1422 may be selected from the group consisting of an acrylic adhesive, a silicone adhesive, and a polyurethane (PU) adhesive.

The first base film 1411 can be a common base film which is commonly used in a laminating machine, having certain hardness and stiffness which can better protect the OLED encapsulation structure 10 and reduces occurrences of being scratched, cracked, crushed, and the like. The material of the second base film 1412 is softer than the material of the first base film 1411, and is easily to bend, stretch, or deform.

The first auxiliary film 1421 can be a common adhesive film which is commonly used in a laminating machine, having certain hardness and stiffness, which can better protect the OLED encapsulation structure 10, and reduce occurrences of being scratched, cracked, crushed, and the like. The material of the second auxiliary film 1422 is softer than the material of the first auxiliary film 1421, and is easily to bend, stretch, or deform. For example, in order to satisfy the requirement of tearing the film in the following process, to ensure that the release force of the protective film is not too high, viscosity of the second auxiliary film 1422 is not greater than (less than or equal to) viscosity of the first auxiliary film 1421, for example, the viscosity of the second auxiliary film 1422 is less than the viscosity of the first auxiliary film 1421, so that the film can be more easily to peel off in a following process. The viscosity of the second auxiliary film 1422 also needs to meet the required viscosity that the OLED encapsulation structure 10 will not be detached when transporting to the next process.

Specifically, when the protective film 14 covers the OLED encapsulation layer 13, the first base film 1411 is adhered by the second base film 1421 which acts as a common adhesive film that is adhered to the first inorganic material layer 131 disposed on the top portion of the OLED encapsulation layer 13 to cover the first inorganic material layer 131 which is disposed on the top portion of the OLED encapsulation layer 13. The auxiliary film 142 is adhered by the second auxiliary film 1422 which acts as a soft adhesive film that is adhered to at least two opposite sides of the OLED encapsulation layer 13 to cover the at least two opposite sides of the OLED encapsulation layer 13.

In some embodiments, the first auxiliary film 1421 covers a peripheral surface of the first base film 1411, and the second auxiliary film 1422 covers a peripheral surface of the second base film 1412.

Specifically, when the protective film 14 covers the OLED encapsulation layer 13, the first base film 1411 is adhered by the second base film 1421 which acts as a common adhesive film that is adhered to the first inorganic material layer 131 disposed on the top portion of the OLED encapsulation layer 13 to cover first inorganic material layer 131 which is disposed on the top portion of the OLED encapsulation layer 13. The auxiliary film 142 is adhered by the second auxiliary film 1422 which acts as a soft adhesive film that is adhered to the peripheral surface of the OLED encapsulation layer 13 to cover the peripheral surface of the OLED encapsulation layer 13.

The OLED encapsulation structure provided by the embodiments of the present application may encapsulate the top portion and the at least two opposite sides of the OLED encapsulation structure by the protective film, wherein the protective film includes the base film and the auxiliary film disposed on the at least two opposite sides of the base film and connected to the base film. The auxiliary film is softer than the base film. When the protective film covers the OLED encapsulation structure, the base film covers the top portion of the OLED encapsulation structure, and the auxiliary film covers the at least two opposite sides of the OLED encapsulation structure. The OLED encapsulation structure can be effectively protected, and can better avoid the dust contamination at an edge portion of the OLED encapsulation structure, and can improve product yield and production efficiency.

Figure 4:
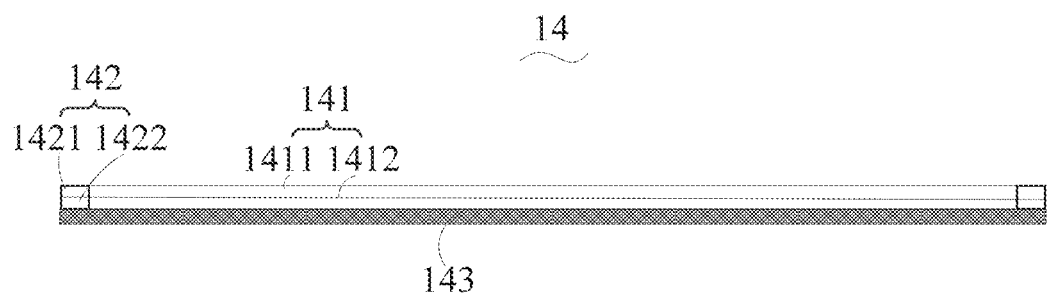
FIG. 4 is a schematic structural view of a protective film provided by an embodiment of the present application.

Please refer to FIG. 4. FIG. 4 is a schematic structural view of a protective film according to an embodiment of the present application. The protective film 14 includes a base film 141, an auxiliary film 142, and a release film 143.

The auxiliary film 142 is disposed on at least two opposite sides of the base film 141, and the auxiliary film 142 is connected to the base film 141. The auxiliary film 142 is softer than the base film 141.

The base film 141 includes a first base film 1411 and a second base film 1412, and the first base film 1411 and the second base film 1412 are stacked on one another. The auxiliary film 142 includes a first auxiliary film 1421 and a second auxiliary film 1422, the first auxiliary film 1421 and the second auxiliary film 1422 are stacked on one another, the first auxiliary film 1421 is connected to the at least two opposite sides of the first base film 1411, and the second auxiliary film 1422 is connected to the at least two opposite sides of the second base film 1412.

For example, material of the first base film 1411 and material of the first auxiliary film 1421 may be selected from the group consisting of polyethylene terephthalate (PET), ortho-phenylphenol (OPP), and polymethylmethacrylate (PMMA).

For example, material of the second base film 1412 and material of the second auxiliary film 1422 may be selected from the group consisting of an acrylic adhesive, a silicone adhesive, and a polyurethane (PU) adhesive.

The first base film 1411 can be a common base film which is commonly used in a laminating machine, having certain hardness and stiffness, which can better protect the OLED encapsulation structure 10, and reduces occurrences of being scratched, cracked, crushed, and the like. The material of the second base film 1412 is softer than the material of the first base film 1411, and is easily to bend, stretch, or deform.

The first auxiliary film 1421 can be a common adhesive film which is commonly used in a laminating machine, having certain hardness and stiffness, which can better protect the OLED encapsulation structure 10, and reduce occurrences of being scratched, cracked, crushed, and the like. The material of the second auxiliary film 1422 is softer than the material of the first auxiliary film 1421, and is easily to bend, stretch, or deform. For example, in order to satisfy the requirement for tearing the film in the following process, to ensure that the release force of the protective film is not too high, viscosity of the second auxiliary film 1422 is not greater than (less than or equal to) viscosity of the first auxiliary film 1421, for example, the viscosity of the second auxiliary film 1422 is less than the viscosity of the first auxiliary film 1421, so that the film can be more easily to peel off in a following process. The viscosity of the second auxiliary film 1422 also needs to meet the required viscosity that the OLED encapsulation structure 10 will not be detached when transporting to the next process.

In some embodiments, the first auxiliary film 1421 covers a peripheral surface of the first base film 1411, and the second auxiliary film 1422 covers a peripheral surface of the second base film 1412.

Wherein, before the protective film 14 is used to cover the OLED encapsulation layer 13, a lower surface of the base film 141 and a lower surface of the auxiliary film 142 are laminated on an upper surface of the has a certain hardness and stiffness, can release film 143. By laminating the lower surfaces of the base film 141 and the auxiliary film 142 on the upper surface of the release film 143, the protective film 14 can be effectively protected, and the release film 143 is peeled off when the protective film 14 is used. It is possible to more effectively avoid dust or moisture contamination of the protective film 14 and to avoid oxidation of the film.

When the protective film 14 covers the OLED encapsulation layer 13, the release film 143 disposed on the protective film 14 is peeled off, and the protective film that the release film 143 peeled off is attached to the OLED encapsulation layer 13 to make that the base film 141 covers the top portion of the OLED encapsulation layer 13, and the auxiliary film 142 covers at least two opposite sides of the OLED encapsulation layer 13.

The protective film for the OLED encapsulation structure provided by the embodiments of the present application may encapsulate the top portion and the at least two opposite sides of the OLED encapsulation layer by the protective film, wherein the protective film includes the base film and the auxiliary film disposed on the at least two opposite sides of the base film, and connected to the base film. The auxiliary film is softer than the base film. When the protective film covers the OLED encapsulation layer, the base film covers the top portion of the OLED encapsulation layer, and the auxiliary film covers the at least two opposite sides of the OLED encapsulation structureencapsulation layer. The protective film can be effectively protected, and can better avoid the dust contamination at an edge portion of the OLED encapsulation layer, and can improve product yield and production efficiency.

In order to further describe the present application, the following description will be made from the direction of a manufacturing method of the protective film for the OLED encapsulation structure and a manufacturing method of the OLED encapsulation structure.

Figure 5:
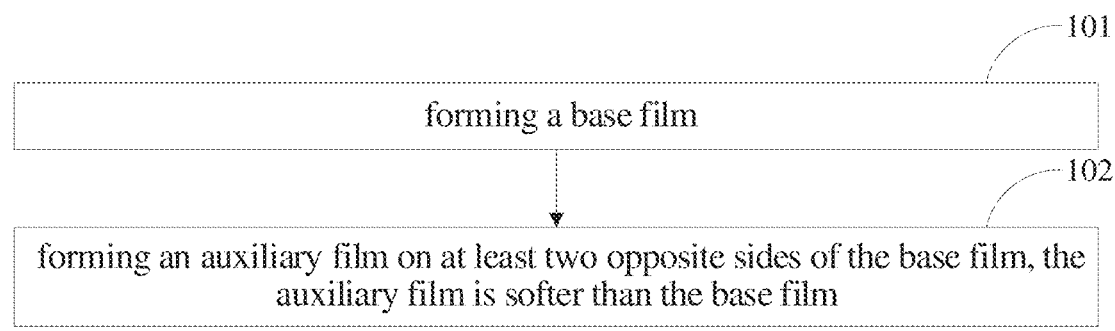
FIG. 5 is a schematic flowchart of a manufacturing method of a protective film for an OLED encapsulation structure according to an embodiment of the present application.
Figure 6:
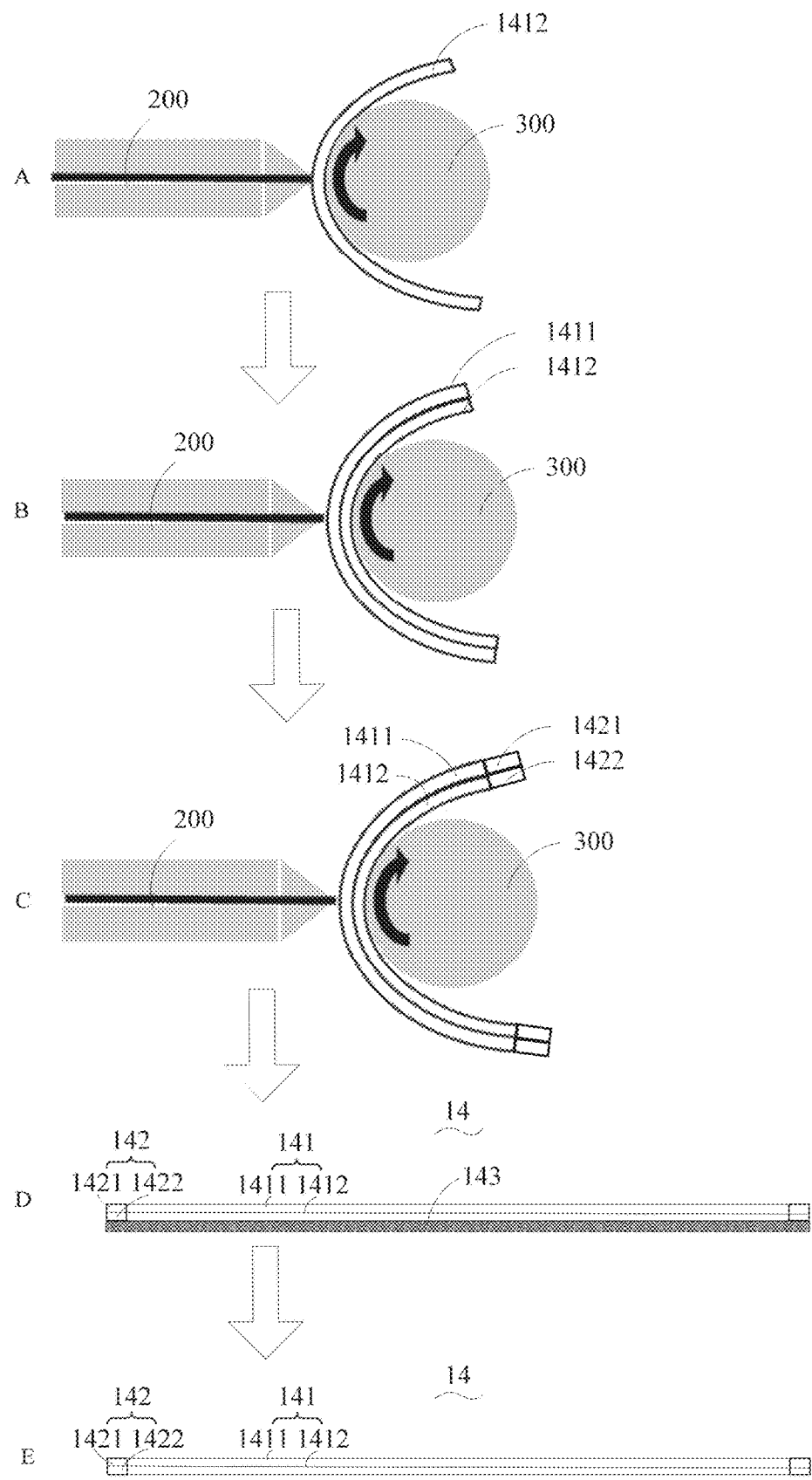
FIG. 6 is a schematic view of a manufacturing process of the protective film according to an embodiment of the present application.

Please refer to FIG. 5 and FIG. 6. FIG. 5 is a schematic flowchart of a manufacturing method of a protective film for an OLED encapsulation structure according to an embodiment of the present invention. FIG. 6 is a schematic view of a manufacturing process of the protective film according to an embodiment of the present application. The manufacturing method of the protective film for the OLED encapsulation structure includes step of:

Step 101, forming a base film. Among that, forming a first base film and a second base film which are stacked on one another.

Step 102, forming an auxiliary film on at least two opposite sides of the base film, wherein the auxiliary film is softer than the base film. Among that, forming a first auxiliary film on at least two opposite sides of the first base film, wherein the first auxiliary film is softer than the first base film, and forming a second auxiliary film on at least two opposite sides of the second base film, wherein the second auxiliary film is softer than the second base film.

In some embodiments, the method further comprises steps of: forming a release film on a lower surface of the base film and a lower surface of the auxiliary film.

For example, the first base film is a common base film, the first auxiliary film is a soft base film, the second base film is a common adhesive film, and the second auxiliary film is a soft adhesive film.

For example, as shown in FIG. 6, the protective film can be produced by using a lip coater or a T-die slot coater, and the specific process is as follows:

A. The common adhesive film 1412 is applied to an intermediate position of a roller 300 by using a lip coater 200.

B. The common base film 1411 is further coated on the common adhesive film 1412.

C. A soft adhesive film 1422 is coated at an edge of the common adhesive film 1412, and then a soft base film 1421 is coated at an edge of the common base film 1411, wherein the soft base film 1421 is coated on the soft adhesive film 1422. Wherein the common base film 1411 and the common adhesive film 1412 are required to have greater hardness and stiffness than the soft base film 1421 and the soft adhesive film 1422.

D. After the coating is completed, the protective film 14 is peeled off from the coater 200 and laminated on a release film 143.

E. While in use, the release film 143 is peeled off from the protective film 14.

The manufacturing method of the protective film for the OLED encapsulation structure provided by the embodiments of the present application, by forming the base film and disposing the auxiliary film on the at least two opposite sides of the base film, and the auxiliary film is softer than the base film. The protective film is provided by the present application, when the protective film covers the OLED encapsulalion layer, the base film covers the top portion of the OLED encapsulation layer, and the auxiliary film covers the at least two opposite sides of the OLED encapsulation layer, which can effectively protect the OLED encapsulation structure, and can better avoid the dust contamination at an edge portion of the OLED encapsulation layer, and can improve product yield and production efficiency.

Figure 7:
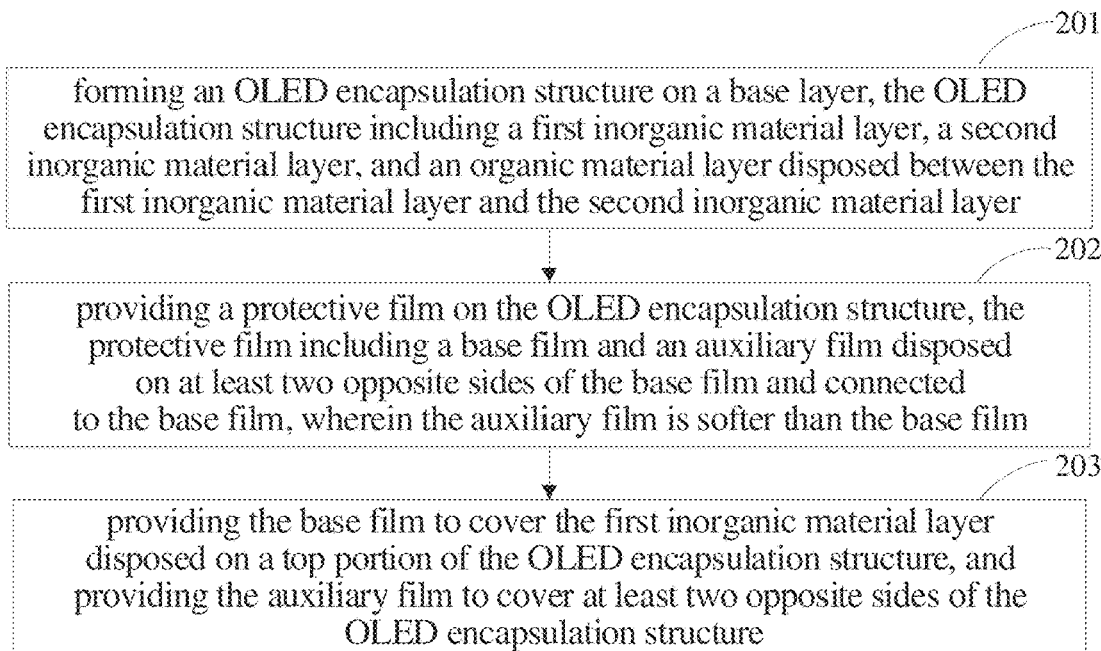
FIG. 7 is a schematic flowchart of a manufacturing method of an OLED encapsulation structure according to an embodiment of the present application.

Please refer to FIG. 7. FIG. 7 is a schematic flowchart of a manufacturing method of an OLED encapsulation structure according to an embodiment of the present application. The manufacturing method of the OLED encapsulation structure includes steps of:

Step 201, forming an OLED encapsulation layer on a base layer, the OLED encapsulation layer including a first inorganic material layer, a second inorganic material layer, and an organic material layer disposed between the first inorganic material layer and the second inorganic material layer;

Step 202, providing a protective film on the OLED encapsulation layer, the protective film including a base film and an auxiliary film disposed on at least two opposite sides of the base film and connected to the base film, wherein the auxiliary film is softer than the base film;

Step 203: providing the base film to cover the first inorganic material layer disposed on a top portion of the OLED encapsulation layer, and providing the auxiliary film to cover at least two opposite sides of the OLED encapsulation layer.

Figure 8:
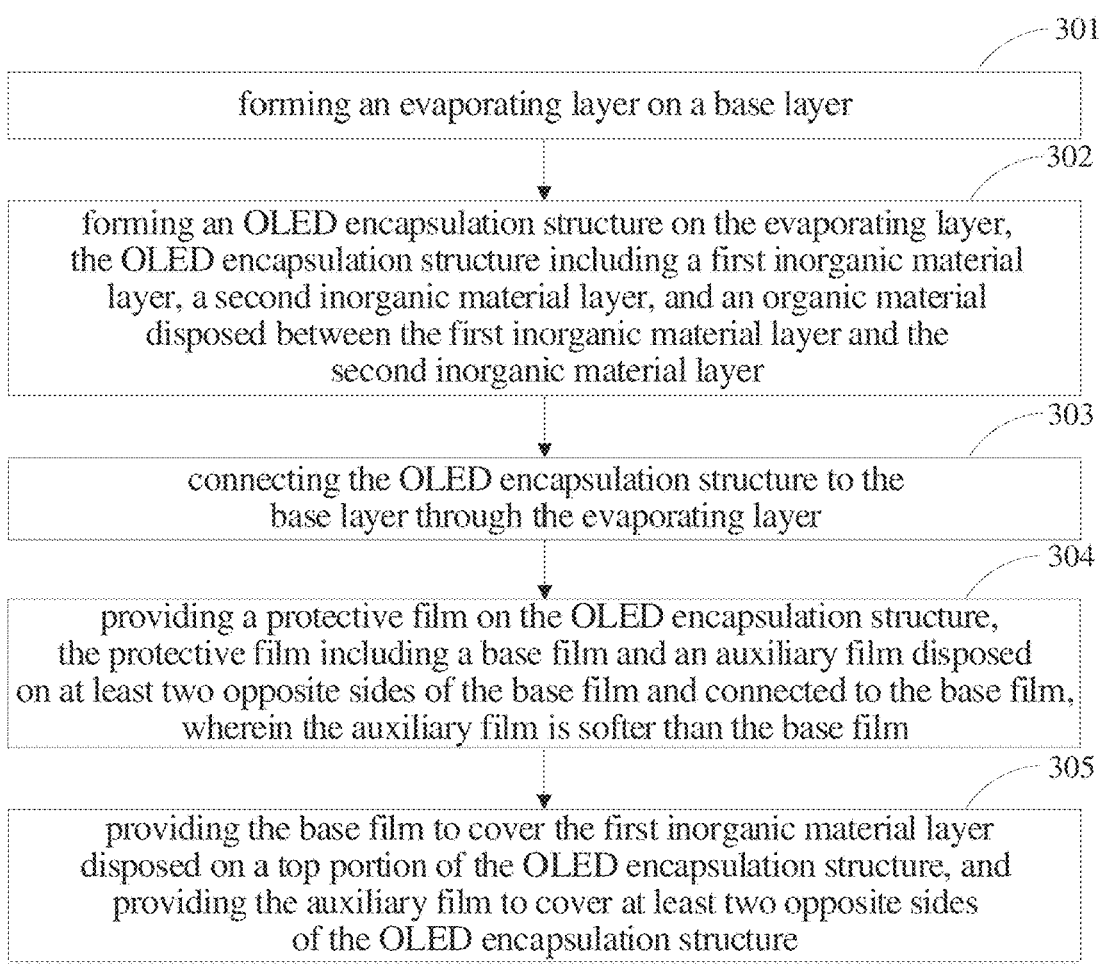
FIG. 8 is another schematic flowchart of a manufacturing method of the OLED encapsulation structure according to an embodiment of the present application.

Please refer to FIG. 8. FIG. 8 is another schematic flowchart of a manufacturing method of an OLED encapsulation structure according to an embodiment of the present application. The manufacturing method of the OLED encapsulation structure includes steps of:

Step 301, forming an evaporating layer on a base layer;

Step 302, forming an OLED encapsulation layer on the evaporating layer, the OLED encapsulation layer including a first inorganic material layer, a second inorganic material layer, and an organic material disposed between the first inorganic material layer and the second inorganic material layer;

Step 303, connecting the OLED encapsulation layer to the base layer through the evaporating layer;

Step 304, providing a protective film on the OLED encapsulation encapsulation layer, the protective film including a base film and an auxiliary film disposed on at least two opposite sides of the base film and connected to the base film, wherein the auxiliary film is softer than the base film;

Step 305, providing the base film to cover the first inorganic material layer disposed on a top portion of the OLED encapsulation layer, and providing the auxiliary film to cover at least two opposite sides of the OLED encapsulation layer.

The manufacturing method of the OLED encapsulation structure provided by the embodiments of the present application, by forming the OLED encapsulation layer on the base layer, the OLED encapsulation layer includes the first inorganic material layer, the second inorganic material layer, and the organic material layer disposed between the first inorganic material layer and the second inorganic material layer; providing the protective film on the OLED encapsulation layer, the protective film includes the base film and the auxiliary film disposed on the at least two opposite sides of the base film and connected to the base film, the auxiliary film is softer than the base film; providing the base film to cover the first inorganic material layer disposed on the top portion of the OLED encapsulation layer, and providing the auxiliary film to cover the at least two opposite sides of the OLED encapsulation layer. It can effectively protect the OLED encapsulation structure, and can better avoid the dust contamination at an edge portion of the OLED encapsulation layer, and can improve product yield and production efficiency.

The organic light-emitting diode (OLED) encapsulation structure, protective film therefor, and manufacturing method of the protective film provided by the embodiments of the present invention are described in detail. The principles and implementations of the present invention are described in combination with specific embodiments. The above description of the embodiments is merely for the purpose of understanding the invention. In the meantime, for those skilled in the art, there will be changes in the specific implementation and application scope according to the idea of the present invention. In conclusion, the content of the specification of the present invention should not be construed as limitations of the scope of the present invention.

What is claimed is:
1. An organic light-emitting diode (OLED) encapsulation structure comprising:
a base layer;
a connecting layer;

an OLED encapsulation layer, the OLED encapsulation layer comprising a first inorganic material layer, a second inorganic material layer, and an organic material layer disposed between the first inorganic material layer and the second inorganic material layer; and a protective layer, the protective layer disposed on a top portion of the OLED encapsulation layer, wherein the protective layer is a protective film for the OLED encapsulation layer, and wherein the protective film comprises a base film and an auxiliary film disposed on at least two opposite sides of the base film and connected to the base film, wherein the auxiliary film is softer than the base film, wherein when the protective film covers the OLED encapsulation layer, the base film covers a top portion of the OLED encapsulation layer, and the auxiliary film covers at least two opposite sides of the OLED encapsulation layer, wherein the auxiliary film extends to the base layer, to extend to the base layer along the peripheral surface of the OLED encapsulation structure and extend to side surfaces of the base layer, the auxiliary film covers the side surfaces of the OLED encapsulation layer, wherein the base film comprises a first base film and a second base film, and the first base film and the second base film being stacked on one another; wherein the auxiliary film comprises a first auxiliary film and a second auxiliary film, and the first auxiliary film and the second auxiliary film being stacked on one another; and wherein the first auxiliary film is connected to at least two opposite sides of the first base film, and the second auxiliary film is connected to at least two opposite sides of the second base film, wherein the material of the second auxiliary film is softer than the material of the first auxiliary film, and is able to bend, stretch, or deform, and wherein adhesion of the second auxiliary film is less than or equal to adhesion of the first auxiliary film.

2. The OLED encapsulation structure according to claim 1, wherein material of the first base film and material of the first auxiliary film are selected from the group consisting of polyethylene terephthalate (PET), ortho-phenylphenol (OPP), and polymethylmethacrylate (PMMA).

3. The OLED encapsulation structure according to claim 1, wherein material of the second base film and material the second auxiliary film are selected from the group consisting of an acrylic adhesive, a silicone adhesive, and a polyurethane (PU) adhesive.

4. The OLED encapsulation structure according to claim 1, wherein the first auxiliary film covers a peripheral surface of the first base film, and the second auxiliary film covers a periphery surface of the second base film.

5. The OLED encapsulation structure according to claim 1, wherein the protective film further comprises a release film, and wherein before the protective film is used to cover the OLED encapsulation layer, a lower surface of the base film and a lower surface of the auxiliary film are laminated on an upper surface of the release film.

6. The OLED encapsulation structure according to claim 1, wherein when the protective film covers the OLED encapsulation layer, the base film covers the first inorganic material layer disposed on the top portion of the OLED encapsulation layer, and the auxiliary film covers a peripheral surface of the OLED encapsulation layer.

7. The OLED encapsulation structure according to claim 6, wherein after the auxiliary film covered the peripheral surface of the OLED encapsulation layer, the auxiliary film automatically falls down and extends along the peripheral surface of the OLED encapsulation layer to the base layer.

\* \* \* \* \*